United States Patent
Vansickel et al.

(10) Patent No.: US 10,505,510 B2
(45) Date of Patent: Dec. 10, 2019

(54) ADJUSTABLE COMPACT LINE OUTPUT CONVERTER WITH AMPLIFIER TRIGGER

(71) Applicant: Audio Accessories Group, LLC, Tempe, AZ (US)

(72) Inventors: Larry Vansickel, Phoenix, AZ (US); Wang Hai, Ningbo (CN); Gu Wen Dong, Ningbo (CN)

(*) Notice: Subject to any disclaimer, the term of this patent is extended or adjusted under 35 U.S.C. 154(b) by 0 days.

(21) Appl. No.: 15/725,159

(22) Filed: Oct. 4, 2017

(65) Prior Publication Data
US 2019/0103845 A1   Apr. 4, 2019

(51) Int. Cl.
*H03G 3/30* (2006.01)
*H03G 3/34* (2006.01)
*H01F 19/02* (2006.01)

(52) U.S. Cl.
CPC ......... *H03G 3/3005* (2013.01); *H03G 3/341* (2013.01); *H01F 19/02* (2013.01); *H03G 3/3026* (2013.01)

(58) Field of Classification Search
CPC .... H03G 3/3005; H03G 3/3026; H03G 3/341; H01F 19/02

USPC ........................................ 381/107
See application file for complete search history.

(56) References Cited

U.S. PATENT DOCUMENTS

2017/0310288 A1* 10/2017 Das ................... H03F 3/183

* cited by examiner

*Primary Examiner* — Vivian C Chin
*Assistant Examiner* — Douglas J Suthers
(74) *Attorney, Agent, or Firm* — Keith L. Jenkins, Registered Patent Attorney, LLC; Keith L. Jenkins

(57) ABSTRACT

A line output converter (LOC) combined with a microprocessor to sense LOC output signal strength and respond to usefully high levels by generating a trigger to turn on an amplifier that is receiving the LOC output signal. A short, first predetermined time is programmed into the microcontroller as a minimum time to sense high signal levels before activating the amplifier, in order to suppress transient signals. A longer, second predetermined time is programmed into the microcontroller as a minimum time to sense low signal levels before deactivating the amplifier. The predetermined boundary between a high and a low signal level is also programmed into the microcontroller and, as with the predetermined times, is established responsive to the characteristics of the particular LOC involved. In an embodiment, the LOC is a compact adjustable LOC located on the same PCB as the microcontroller.

20 Claims, 7 Drawing Sheets

ADJUSTABLE COMPACT LINE OUTPUT CONVERTER WITH AMPLIFIER TRIGGER

FIELD OF ART

The present invention relates to line output converters (LOCs), which are interfaces between a high power audio source and a lower power audio destination. The invention is particularly related to an adjustable compact line output converter having high performance, a small form factor and/or a microcontroller-controlled trigger to turn the amplifier on or off, depending on signal strength out of the LOC.

CROSS REFERENCE TO RELATED APPLICATIONS

None.

STATEMENT REGARDING FEDERALLY SPONSORED RESEARCH AND DEVELOPMENT

None.

SUMMARY OF THE INVENTION

A high-performance adjustable compact line output converter with a microcontroller-controlled trigger for turning an amplifier on or off and preferably having a reduced height and size and featuring miniaturized PERMALLOY transformers countersunk into openings in a printed circuit board that also supports RCA output connectors and the remaining circuitry for the line output converter.

DESCRIPTION OF THE FIGURES OF THE DRAWINGS

The present invention will hereinafter be described in conjunction with the following drawing figures, wherein like numerals denote like elements.

DETAILED DESCRIPTION OF THE INVENTION

Figure 1:
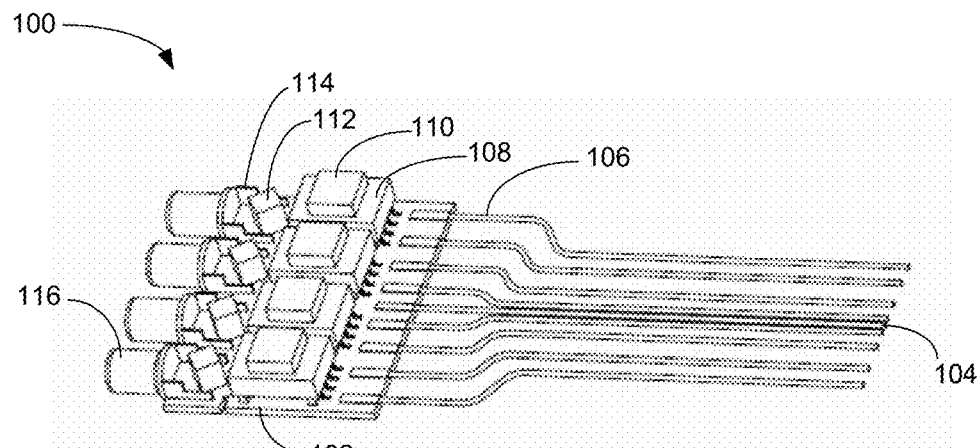
FIG. 1 is atop side perspective view illustrating an exemplary embodiment of an adjustable compact line output converter (LOC), according to a preferred embodiment of the present invention.

FIG. 1 is a top side perspective view illustrating an exemplary embodiment of an adjustable compact line output converter (LOC) 100, according to a preferred embodiment of the present invention. Printed circuit board (PCB) 102 is the support for four-channel adjustable compact LOC 100, including RCA output jacks 116 (one of four labeled) (including attachment hardware 114). Output audio signals are supplied to RCA jacks 116 via variable resistors 112 (one of four labeled) from transformers 110 (one of four labeled) which are mounted in chassis 108 (one of four labeled). The signals into the transformers 110 are supplied via circuitry (not shown) input line 106 (one of eight labeled, two per channel), and optionally through additional filtering and impedance matching circuitry (not shown). Power is supplied to the adjustable compact LOC 100 via twisted pair wire 104.

Figure 2:
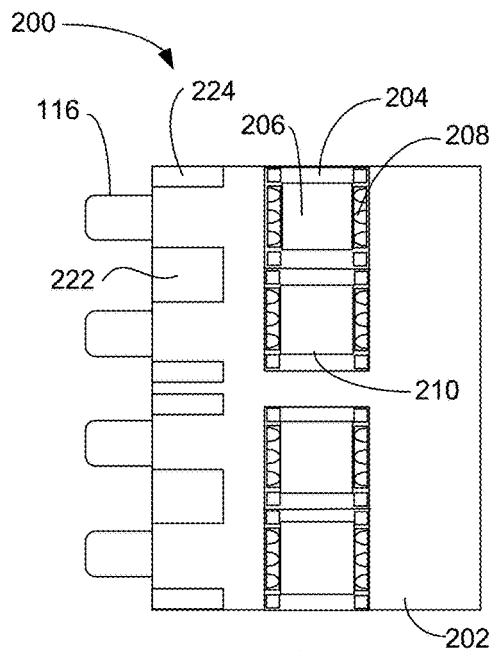
FIG. 2 is a bottom plan diagrammatic view illustrating another exemplary embodiment of the adjustable compact LOC, according to a preferred embodiment of the present invention.

FIG. 2 is a bottom plan diagrammatic view illustrating another exemplary embodiment of an adjustable compact LOC 200, according to a preferred embodiment of the present invention. PCB 202 supports chassis 308 (see FIG. 3, one of four labeled)) having front and rear wire guide bottom edges 208 (one of eight labeled) and plain chassis bottom side surfaces 204 (one of eight labeled). Chassis 308 has openings 210 bounded by front and rear wire guide bottom edges 208 and by plain chassis bottom side surfaces 204. Transformers 206 (one of four labeled) are mounted in chassis 308 and are visible in this view through openings 210 as chassis 308 extends partially through openings 402 (see FIG. 4) in PCB 202. Soldering pads 224 and 222 are for mechanical connection of RCA output jacks 116 to PCB 202. Variable resistors 312 may be used for impedance matching, signal attenuation, or both.

Figure 3:
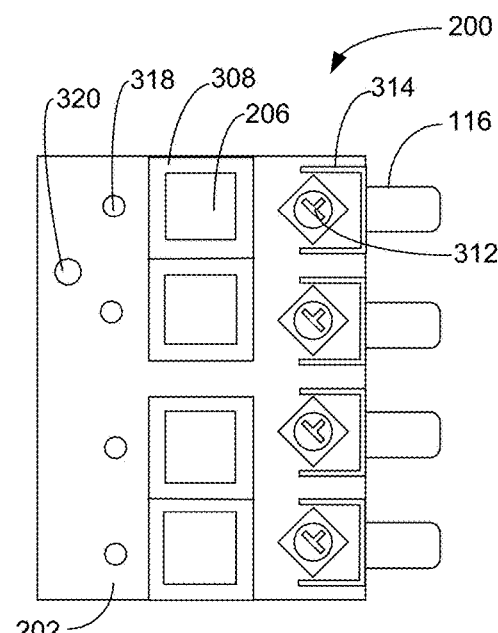
FIG. 3 is a top plan diagrammatic view illustrating the exemplary embodiment of the adjustable compact LOC of FIG. 2, according to a preferred embodiment of the present invention.

FIG. 3 is a top plan diagrammatic view illustrating the exemplary embodiment of the adjustable compact LOC 200 of FIG. 2, according to a preferred embodiment of the present invention. RCA output jack supports 314 (one of four labeled) attach to PCB 202. Output audio signals are supplied to RCA jacks 116 via variable resistors 312 (one of four labeled) from transformers 206 (one of four labeled) which are mounted in chassis 308 (one of four labeled). The signals into the transformers 206 are supplied via circuitry (not shown), input line 106 (see FIG. 1), and optionally through additional filtering and impedance matching circuitry. Electrical components 318, illustrated as can-type capacitors, and larger component 320, illustrated as an electrolytic capacitor, are exemplary of circuit elements that may, along with resistors, diodes, and transistors, condition the input by filtering or limiting each channel. Other circuitry may include a remote sensing auto trigger to sense an audio signal presence to turn on the audio destination device and delay the input audio signals until the destination audio device has turned on. Additional circuitry may include a ground loop isolator.

Figure 4:
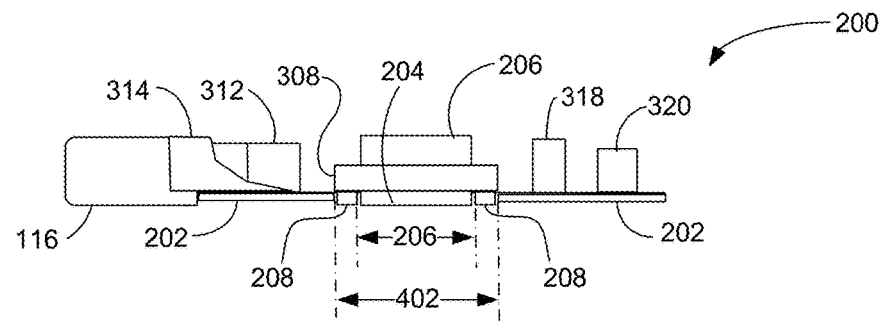
FIG. 4 is a side elevation diagrammatic view illustrating an exemplary embodiment of the adjustable compact LOC of FIG. 2, according to a preferred embodiment of the present invention.

FIG. 4 is a side elevation diagrammatic view illustrating an exemplary embodiment of the adjustable compact LOC 200 of FIG. 2, according to a preferred embodiment of the present invention. The entire adjustable compact LOC 200 has a height less than or equal to the height of the RCA input jack 116. The installation of the chassis 308, with wire guides 208 and bottom side walls 204, can be seen to be within an opening 210 in PCB 202. By the combination of miniaturizing the PERMALLOY transformers 206 and installing them in an opening 402 in the PCB 202, the small form factor is achieved.

Figure 5:
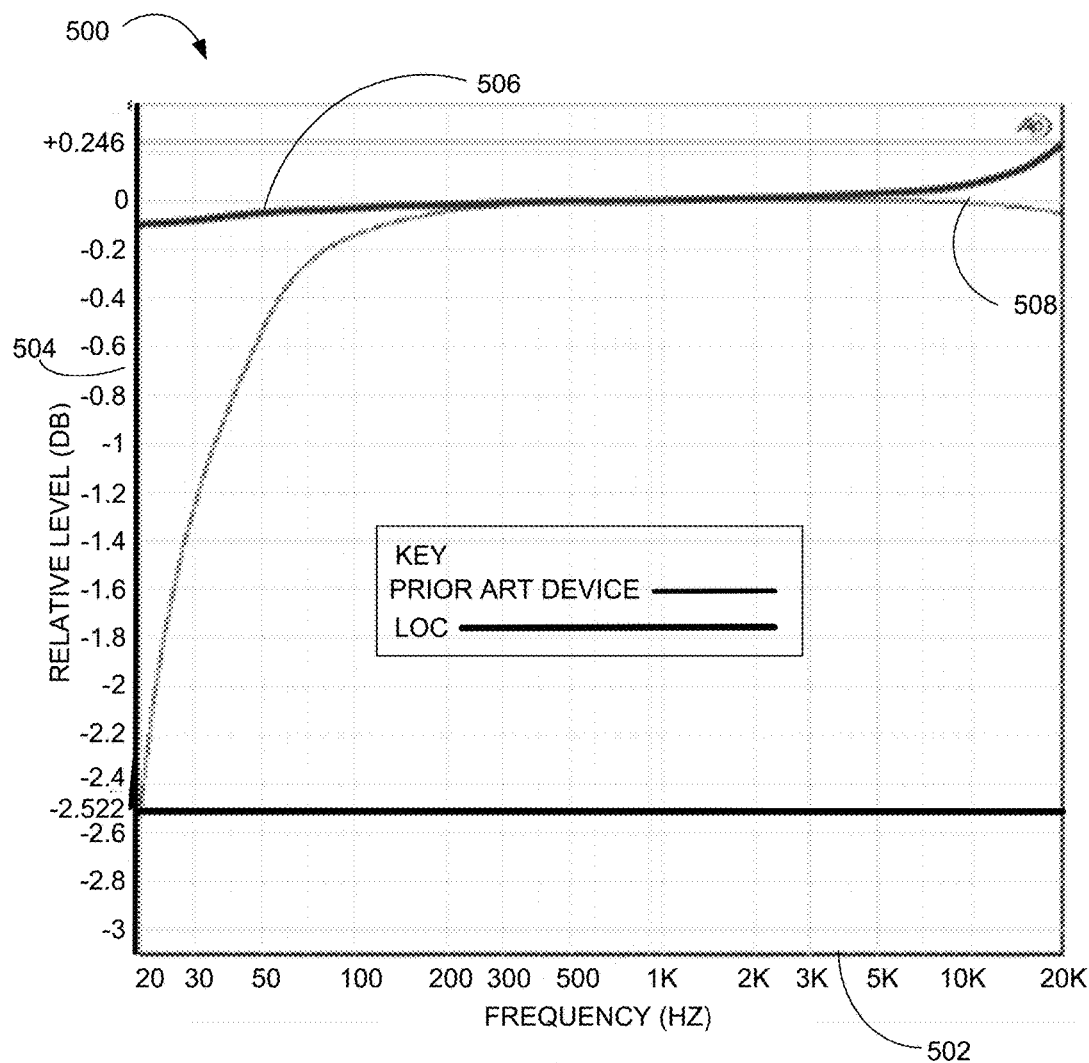
FIG. 5 is a graphic view illustrating the performance of the exemplary embodiment of the adjustable compact LOC of FIG. 2 compared to a prior art device, according to a preferred embodiment of the present invention.

FIG. 5 is a graphic view illustrating the performance of the exemplary embodiment of the adjustable compact LOC 200 of FIG. 2 compared to a prior art device, according to a preferred embodiment of the present invention. The graph 500 displays relative level (dB) 504 (vertical axis) versus frequency (Hz) 502 on the horizontal axis. As can be seen, the curve 506, representing the adjustable compact LOC 200 exhibits superior relative level (dB) at high and low frequencies as compared to curve 508, which represents a prior art device.

Figure 6:
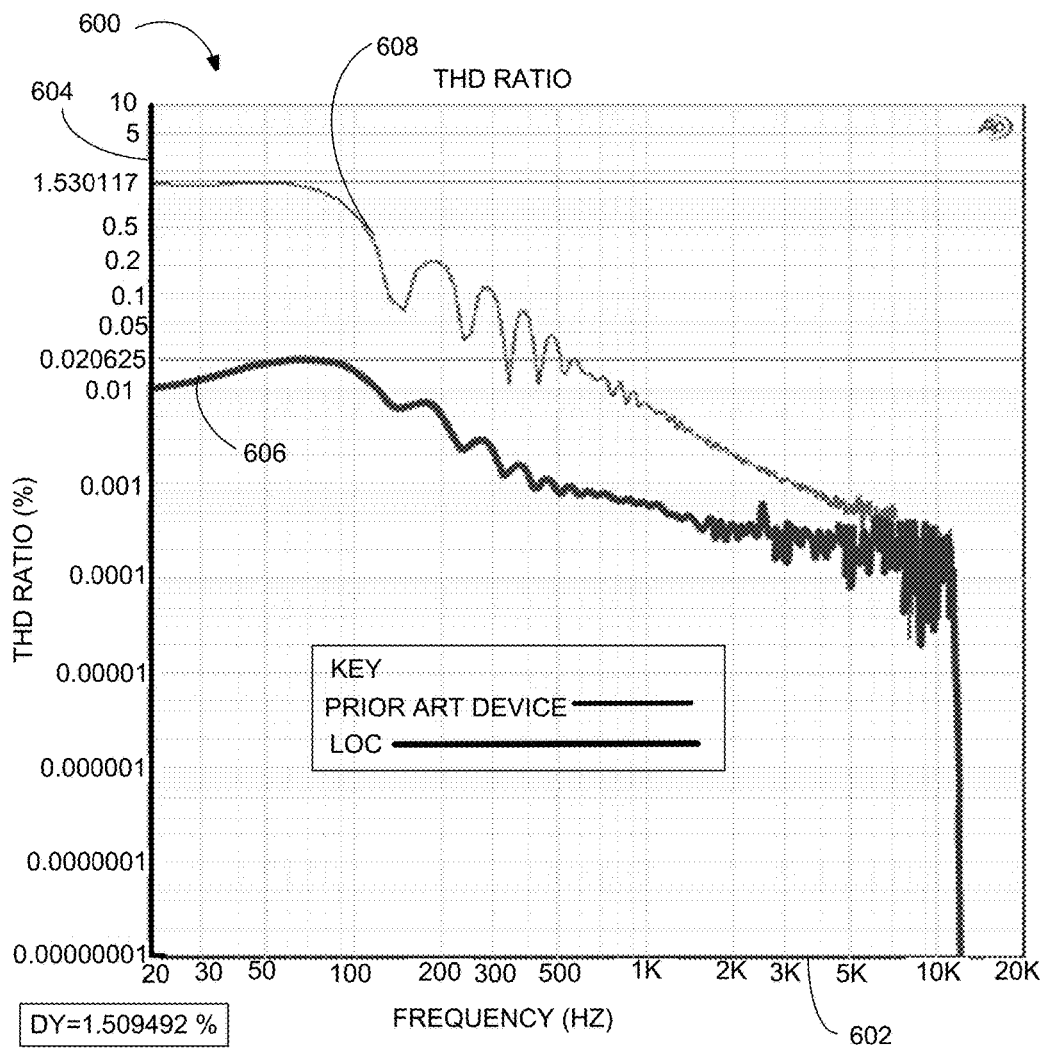
FIG. 6 is a graphic view illustrating the performance of the exemplary embodiment of the adjustable compact LOC of FIG. 2, according to a preferred embodiment of the present invention.

FIG. 6 is a graphic view illustrating the performance of the exemplary embodiment of the adjustable compact LOC 200 of FIG. 2, according to a preferred embodiment of the present invention. Graph 600 graphs total harmonic distortion (THD) ratio (%) on the vertical axis 604 as a function of frequency (Hz) on the horizontal axis 602. Line 606, representing the performance of the adjustable compact LOC 200, shows a THD ratio lower or equal to the performance line 608 for the prior art device.

Figure 7:
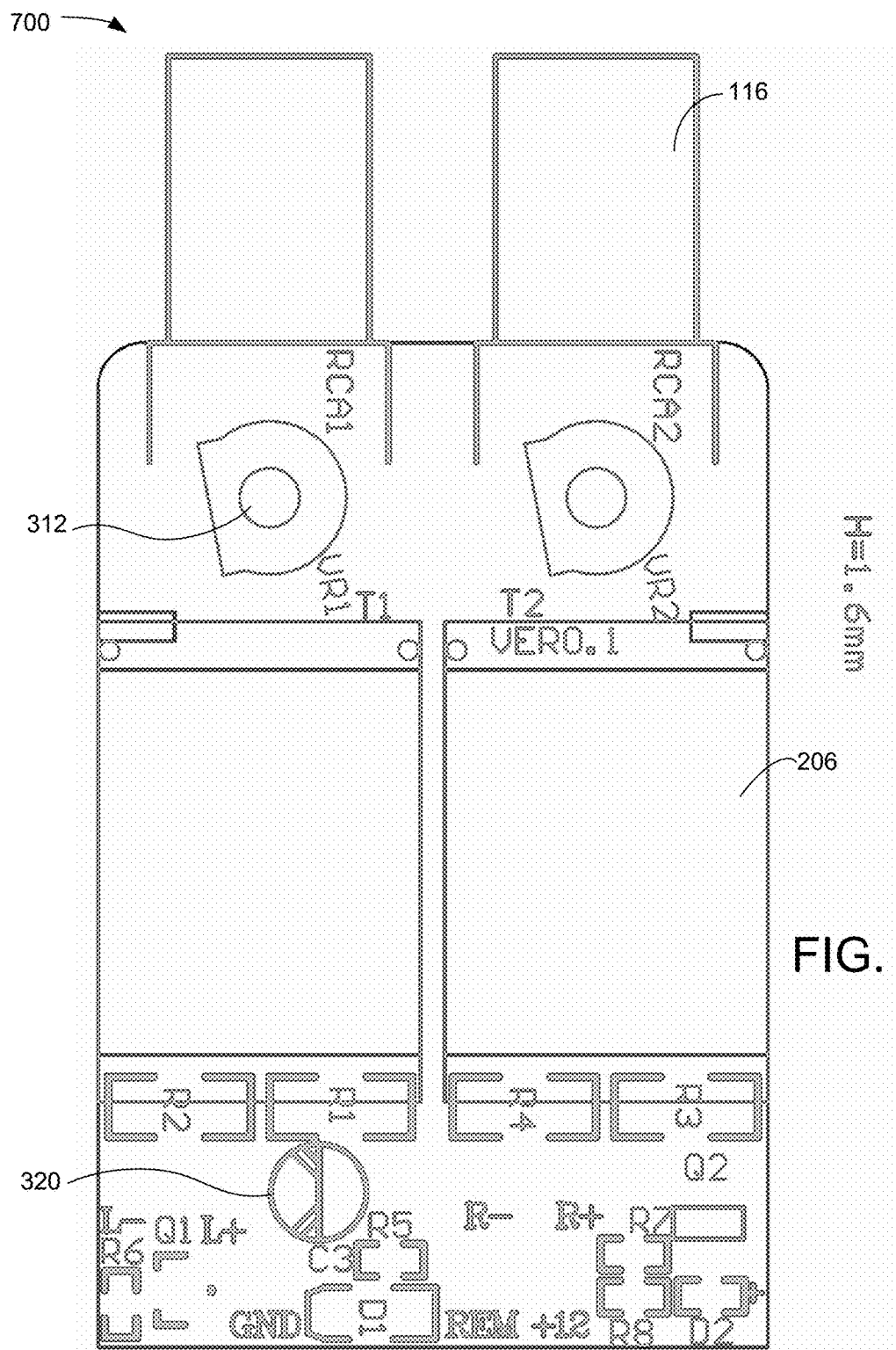
FIG. 7 is a top plan diagrammatic view illustrating a PCB layout for a two-channel adjustable compact LOC, according to a preferred embodiment of the present invention.

FIG. 7 is a top plan diagrammatic view illustrating a PCB layout for a 2-channel adjustable compact LOC 700, according to a preferred embodiment of the present invention. Adjustable compact LOC 700 has only two channels, and the circuitry for each channel is similar to each channel for adjustable compact LOC 200. FIG. 7 is provided to assist with enablement.

Figure 8:
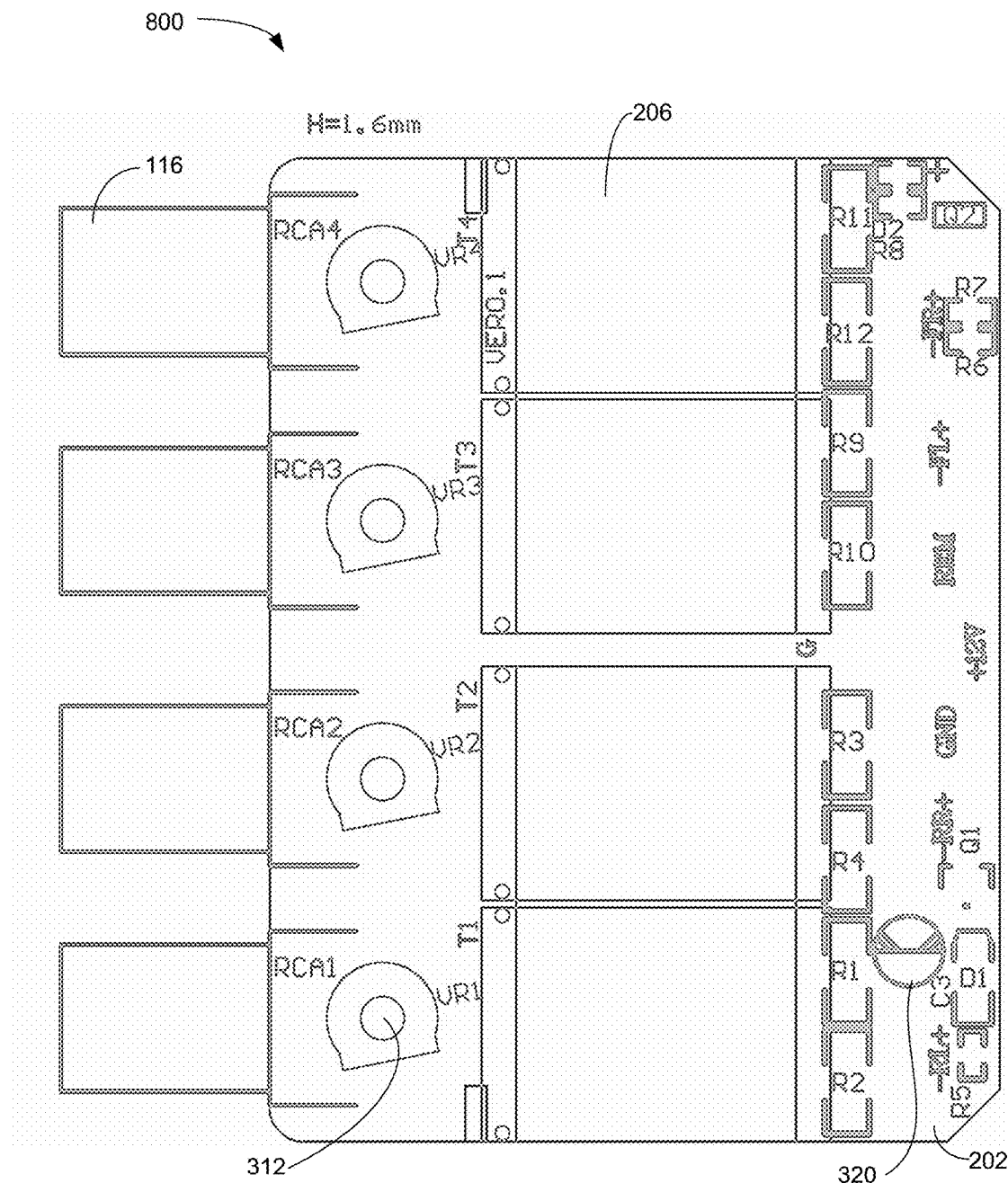
FIG. 8 is atop plan diagrammatic view illustrating an exemplary embodiment of a PCB layout for a four-channel adjustable compact LOC, according to a preferred embodiment of the present invention.

FIG. 8 is a top plan diagrammatic view illustrating a PCB layout for a 4-channel adjustable compact LOC 800, according to a preferred embodiment of the present invention. Adjustable compact LOC 800 may be adjustable compact LOC 200. FIG. 8 is provided to assist with enablement.

While the exemplary embodiments have been illustrated as components and circuit boards, those of skill in the art will understand that the device is marketed within a casing from which the RCA output jacks 116 protrude and which provides openings for access for adjusting the variable resistors 312, as well as providing an outlet for the output wires 106 and an inlet for the power supply wires 104. In another embodiment, RCA output jacks 116 may be replaced with 3.5 mm jacks. In other embodiments, other output jacks, such as those used in professional audio equipment, may be used.

Figure 9:
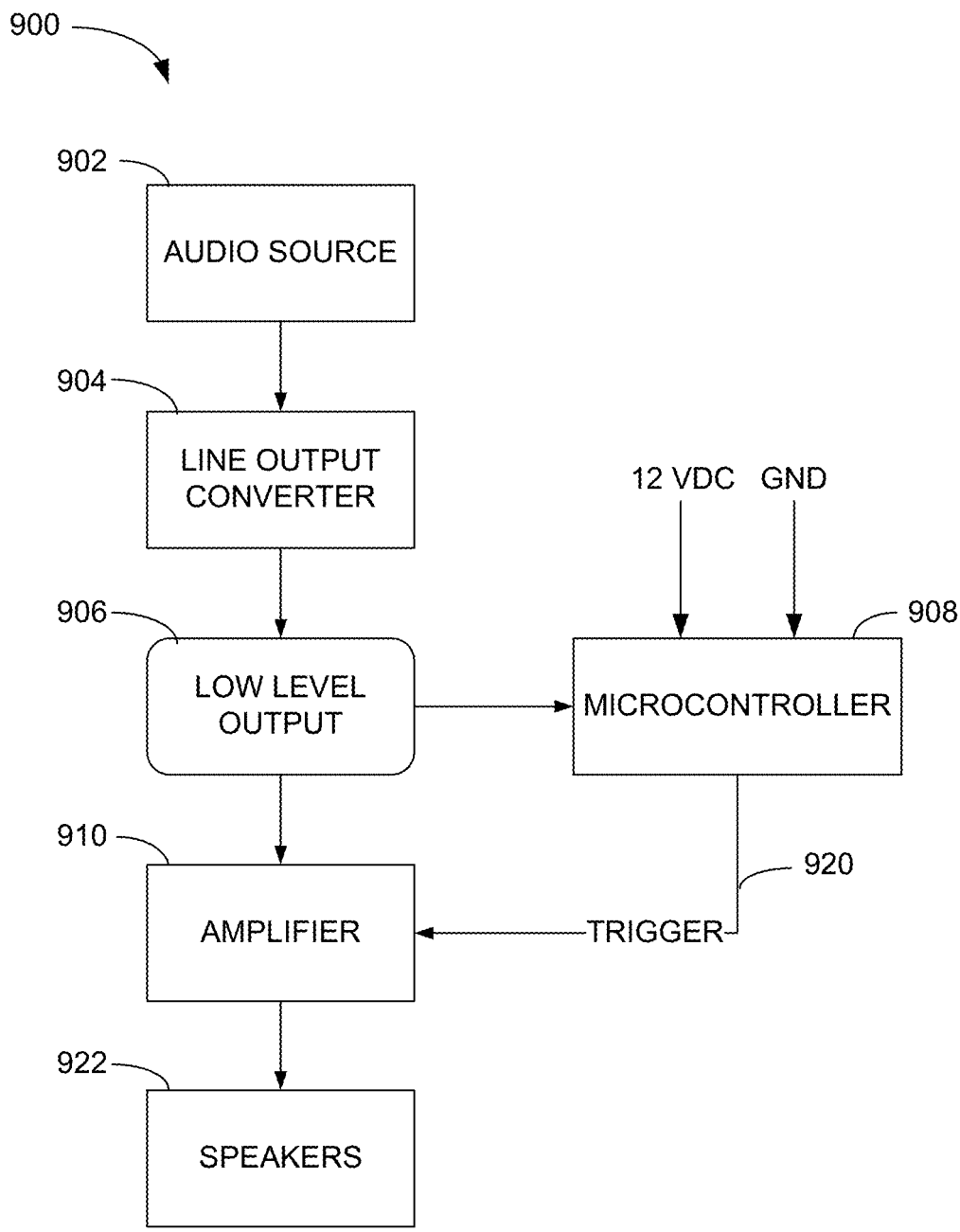
FIG. 9 is a diagrammatic view illustrating an exemplary LOC system circuit including a microcontroller trigger for automatically turning on an amplifier, according to a preferred embodiment of the present invention.

FIG. 9 is a diagrammatic view illustrating an exemplary LOC system circuit 900 including a microcontroller trigger 920 for automatically turning on and off an amplifier 910, according to a preferred embodiment of the present invention. Audio source 902 may be any source of an audio signal including, for non-limiting examples, compact discs, radio, TV, iPod, any digital audio file player producing an analog output, any analog audio player, and the like. Audio source 902 provides an audio signal to LOC 904, which may be any of the LOC embodiments 100, 200, etc. above or any other LOC within the scope of the claims, below. The LOC 904 converts the received audio signal to a low level output 906, suitable for inputting to an amplifier 910. The low level output 906 is also supplied to microcontroller 908, which tests for the presence of a predetermined limit on signal strength. Microcontroller 908 is responsive to a signal strength above the predetermined limit for a predetermined amount of time to send an "ON" trigger signal 920 to the amplifier 910 to turn the amplifier on. The predetermined signal strength is programmed to eliminate background noise from entering the amplifier 910, and may be variously programmed for various respective LOC designs or various LOC adjusted outputs. The first predetermined amount of time is programmed to eliminate spurious signals from the low level output 906, and may be variously programmed for various LOC designs or various LOC adjusted outputs. A signal strength below the predetermined limit for a second predetermined time results in an "OFF" trigger signal 920 being sent to amplifier 910 to turn off the amplifier. Amplifier 910, when operating, sends amplified audio to speakers 922. Speakers 922 include conventional acoustic drivers, as well as ear buds, head phones, and the like.

Figure 10:
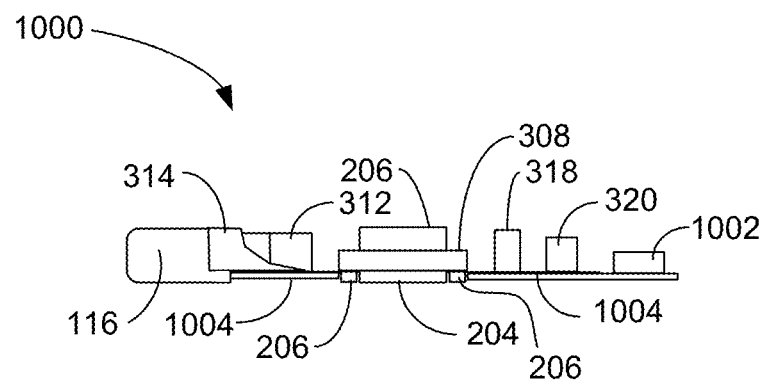
FIG. 10 is a side elevation diagrammatic view illustrating an exemplary embodiment of the adjustable compact LOC having an amplifier trigger, according to a preferred embodiment of the present invention.

FIG. 10 is a side elevation diagrammatic view illustrating an exemplary embodiment of the adjustable compact LOC having an amplifier trigger 1000, according to a preferred embodiment of the present invention. PCB 1004 is extended in length as compared to PCB 202 in order accommodate mounting microcontroller 1002. The height constraint of keeping the entire device 1000 no higher than RCA connector 116 is maintained.

Figure 11:
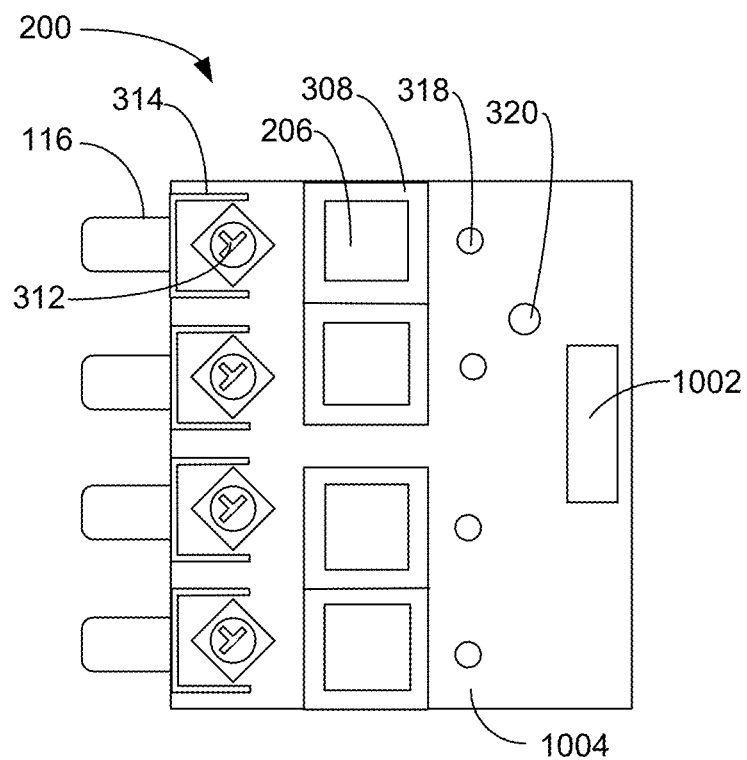
FIG. 11 is a top plan diagrammatic view illustrating the exemplary embodiment of the adjustable compact LOC having an amplifier trigger of FIG. 10, according to a preferred embodiment of the present invention.

FIG. 11 is a top plan diagrammatic view illustrating the exemplary embodiment of the adjustable compact LOC having an amplifier trigger 1000 of FIG. 10, according to a preferred embodiment of the present invention. PCB 1004 is extended in length as compared to PCB 202 in order accommodate mounting microcontroller 1002. The height constraint of keeping the entire device 1000 no higher than RCA connector 116 is maintained.

Those of skill in the art, enlightened by the present disclosure, will understand various circuit configurations that will achieve the purpose of providing an LOC with a microcontroller-controlled amplifier trigger, particularly in small form factor. The small form factor may be relative to the larger connectors used in professional audio equipment.

We claim:

1. A line output converter with an amplifier trigger comprising:
   a. a line output converter adapted to produce a low-level audio signal output from an audio source input;
   b. a microcontroller in communication with said line output converter in relation to said low-level audio signal output and adapted to determine if:
     i. the low-level output exceeds a predetermined signal strength for a first predetermined period of time; or
     ii. the low-level output does not exceed said predetermined signal strength for a second predetermined period of time;
   c. wherein said microcontroller is responsive to said determination to supply one of an ON trigger and an OFF trigger, respectively, to an amplifier; and
   d. wherein said line output converter comprises at least one transformer mounted countersunk within an opening in a circuit board of said line output converter.

2. The line output converter with an amplifier trigger of claim 1, wherein said first and second predetermined periods of time are programmed into said microprocessor.

3. The line output converter with an amplifier trigger of claim 2, wherein said first and second predetermined periods of time are programmed into said microprocessor responsive to characteristics of said line output converter.

4. The line output converter with an amplifier trigger of claim 1, wherein said predetermined signal strength level is programmed into said microprocessor.

5. The line output converter with an amplifier trigger of claim 4, wherein said predetermined signal strength level is programmed into said microprocessor responsive to characteristics of said line output converter.

6. The line output converter with an amplifier trigger of claim 1, comprising said audio source.

7. The line output converter with an amplifier trigger of claim 1, comprising said amplifier.

8. The line output converter with an amplifier trigger of claim 7, comprising at least one speaker.

9. The line output converter with an amplifier trigger of claim 1, wherein said line output converter comprises a height no greater than an RCA connector that is mounted on said circuit board.

10. The line output converter with an amplifier trigger of claim 9, wherein said compact line output converter comprises an adjustable compact line level output converter.

11. The line output converter with an amplifier trigger of claim 9, wherein said microcontroller is mounted on the same PCB as said compact line output converter.

12. A line output converter with an amplifier trigger comprising:
   a. a line output converter adapted to produce a low-level audio signal output from an audio source input;
   b. a microcontroller in communication with said line output converter in relation to said low-level audio signal output and adapted to determine if:
      i. the low-level output exceeds a predetermined signal strength for a first predetermined period of time; or
      ii. the low-level output does not exceed said predetermined signal strength for a second predetermined period of time;
   c. wherein said microcontroller is responsive to said determination to supply one of an ON trigger and an OFF trigger, respectively, to an amplifier;
   d. wherein said first and second predetermined periods of time are programmed into said microprocessor; and
   e. wherein said line output converter comprises at least one transformer mounted countersunk within an opening in a circuit board of said line output converter.

13. The line output converter with an amplifier trigger of claim 12, wherein:
   a. said first and second predetermined periods of time are programmed into said microprocessor responsive to characteristics of said line output converter; and
   b. said predetermined signal strength level is programmed into said microprocessor.

14. The line output converter with an amplifier trigger of claim 12, wherein said predetermined signal strength level is programmed into said microprocessor responsive to characteristics of said line output converter.

15. The line output converter with an amplifier trigger of claim 12, comprising at least one of:
   a. said audio source;
   b. said amplifier; and
   c. at least one speaker.

16. The line output converter with an amplifier trigger of claim 12, wherein said line output converter comprises:
   a. a height no greater than an RCA connector that is mounted on said circuit board; and
   b. manually operable variable resistors adapted for adjusting said compact line output converter.

17. The line output converter with an amplifier trigger of claim 16, wherein said microcontroller is mounted on the same PCB as said compact line output converter.

18. A line output converter with an amplifier trigger comprising:
   a. a line output converter adapted to produce a low-level audio signal output from an audio source input;
   b. a microcontroller in communication with said line output converter in relation to said low-level audio signal output and adapted to determine if:
      i. the low-level output exceeds a predetermined signal strength for a first predetermined period of time; or
      ii. the low-level output does not exceed said predetermined signal strength for a second predetermined period of time;
   c. wherein said microcontroller is responsive to said determination to supply one of an ON trigger and an OFF trigger, respectively, to an amplifier;
   d. wherein said first and second predetermined periods of time are programmed into said microprocessor; and
   e. said predetermined signal strength level is programmed into said microprocessor; and
   f. at least one transformer mounted countersunk within an opening in a circuit board of said line output converter.

19. The line output converter with an amplifier trigger of claim 18, wherein said line output converter comprises a compact line output converter further comprising:
   a. a height no greater than an RCA connector that is mounted on said circuit board; and
   b. manually operable variable resistors adapted for adjusting output levels of said compact line output converter.

20. The line output converter with an amplifier trigger of claim 19, wherein said microcontroller is mounted on the same PCB as said compact line output converter.

* * * * *